US007111269B2

(12) United States Patent
Satapathy et al.

(10) Patent No.: US 7,111,269 B2
(45) Date of Patent: Sep. 19, 2006

(54) COMPARISON OF TWO HIERARCHICAL NETLIST TO GENERATE CHANGE ORDERS FOR UPDATING AN INTEGRATED CIRCUIT LAYOUT

(75) Inventors: Lalita Satapathy, Milpitas, CA (US); Santhanakris Raman, Fremont, CA (US); Richard Blinne, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 277 days.

(21) Appl. No.: 10/693,075

(22) Filed: Oct. 23, 2003

(65) Prior Publication Data

US 2005/0091627 A1    Apr. 28, 2005

(51) Int. Cl.
*G06F 9/455* (2006.01)
(52) U.S. Cl. .............................. 716/11; 716/2; 716/12; 716/18
(58) Field of Classification Search ................. 716/2, 716/4, 5, 6, 7, 10, 11, 12, 18; 707/1
See application file for complete search history.

(56) References Cited

U.S. PATENT DOCUMENTS

| | | | | |
|---|---|---|---|---|
| 5,452,239 A * | 9/1995 | Dai et al. ..................... | 703/19 |
| 5,493,508 A | 2/1996 | Dangelo et al. ............. | 364/489 |
| 5,870,308 A | 2/1999 | Dangelo et al. ............. | 364/489 |
| 6,014,506 A * | 1/2000 | Hossain et al. .............. | 716/11 |
| 6,219,821 B1 | 4/2001 | Hagermann et al. ......... | 716/5 |
| 6,260,177 B1 * | 7/2001 | Lee et al. .................... | 716/2 |
| 6,453,454 B1 * | 9/2002 | Lee et al. .................... | 716/11 |
| 6,530,073 B1 * | 3/2003 | Morgan ....................... | 716/18 |
| 6,536,028 B1 * | 3/2003 | Katsioulas et al. ........... | 716/17 |
| 6,629,300 B1 * | 9/2003 | Otake .......................... | 716/8 |
| 6,651,235 B1 * | 11/2003 | Dai et al. ..................... | 716/7 |
| 6,725,435 B1 * | 4/2004 | Cote et al. ................... | 716/5 |
| 6,745,371 B1 * | 6/2004 | Konstadinidis et al. ...... | 716/2 |
| 6,966,045 B1 * | 11/2005 | Otaguro ....................... | 716/18 |
| 7,028,280 B1 * | 4/2006 | Liu et al. ..................... | 716/8 |
| 2003/0172045 A1 * | 9/2003 | Rindner ........................ | 707/1 |
| 2004/0230933 A1 * | 11/2004 | Weaver et al. ............... | 716/12 |

OTHER PUBLICATIONS

Kim et al., "Hierarchical LVS based on hierarchy rebuilding", Feb. 10-13, 1998, Design Automation Conference 1998. Proceedings of the ASP-DAC '98, Asia and South Pacific, pp. 379-384.*

Batra et al., "Hcompare: a hierarchical netlist comparison program", Jun. 8-12, 1992, Design Automation Conference, 1992. Proceedings., 29th ACM/IEEE, pp. 299-304.*

Pelzet al., "Circuit comparison by hierarchical pattern matching", Nov. 11-14, 1991, Computer-Aided Design, Digest of Technical Papers., IEEE International Conference on, pp. 290-293.*

(Continued)

*Primary Examiner*—A. M. Thompson
*Assistant Examiner*—Helen Rossoshek
(74) *Attorney, Agent, or Firm*—Strategic Patent Group, Inc.

(57) ABSTRACT

A method and system for optimizing a netlist change order flow is disclosed, wherein a design layout created by a layout tool using a reference netlist is to be changed by a modified version of the netlist, and wherein both netlists are hierarchical comprising. Aspects of the present invention include comparing the modified netlist with the original netlist outside of the layout tool, and automatically generating at least one change order based on differences found between the two netlists. After the change order is generated, the change order is then applied to the design layout to generate a modified design layout.

26 Claims, 7 Drawing Sheets

OTHER PUBLICATIONS

Daglio et al., "Building the hierarchy from a flat netlist for a fast and accurate post-layout simulation with parasitic components", Feb. 16-20, 2004, Design, Automation and Test in Europe Conference and Exhibition. Proceedings, vol. 3, p. 336.*

* cited by examiner

FIG. 1

PRIOR ART

```
// Sample hierarchical Reference Netlist.

module foo(A1,A2,Z);

input A1,A2;
output Z;
wire n1,n2;

AND2AFP u1(.A(A1),.B(A2),.Z(n1));

N1AFP u2(.A(n1),.Z(n2));

BUFAFP u3(.A(n2));

hier_module  u4(n2,Z);

endmodule module hier_module(B,Z);
input B;
output Z;

FD1QAFP u5(.D(B),.Q(Z));

endmodule
```

```
// Sample hierarchical Modified Netlist module foo(A1,A2,Z);

input A1,A2;
output Z;

wire n1;

// AND2AFP cell-type changed by the designer.
    // to do some logic restructuring.
    ND2AFP u1(.A(A1),.B(A2),.Z(n1));

BUFAFP u3(.A(n1));

// The herarchical module.
    hier_module u4(n1,Z);

endmodule module hier_module(B,Z);
input B;
output Z;

// New net-added by the user.
wire n_n;

// New buffer added by the user.
    BUFAFP u_n(.A(B),.Z(n_n));

// Flop type changed to a stronger one.
    FD1QCFP u5(.D(n_n),.Q(Z));

endmodule
```

COMPARISON OF TWO HIERARCHICAL NETLIST TO GENERATE CHANGE ORDERS FOR UPDATING AN INTEGRATED CIRCUIT LAYOUT

FIELD OF THE INVENTION

The present invention relates to implementing integrated circuit design changes post-layout in a timing enclosure iteratively loop, and more particularly to a method for generating engineering change orders outside of a layout tool by comparing two hierarchical netlist.

BACKGROUND OF THE INVENTION

Figure 1:
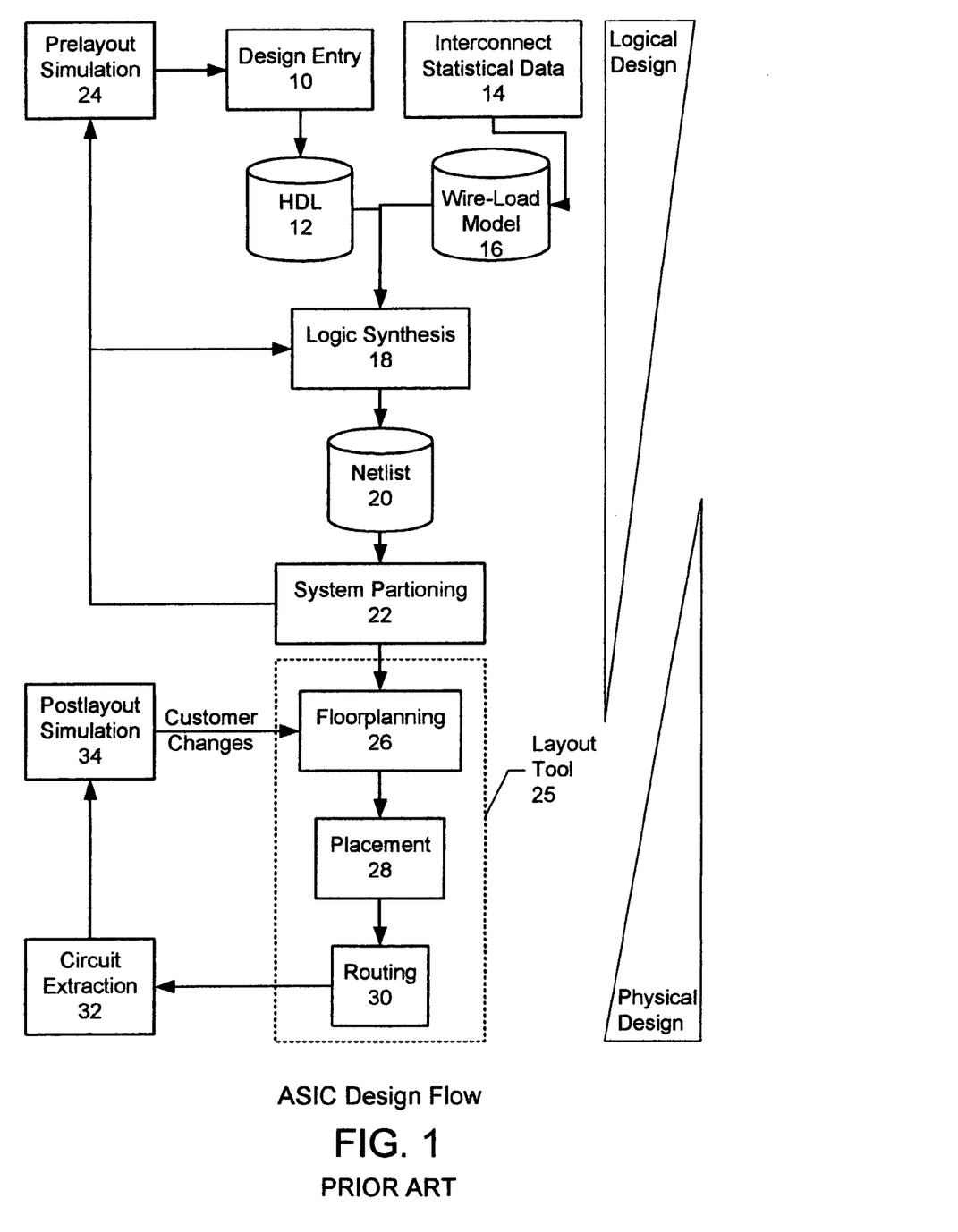
FIG. 1 is a block diagram illustrating a basic design flow for fabricating an ASIC.

FIG. 1 is a block diagram illustrating a basic design flow for fabricating an ASIC. The design flow includes a front-end design process that creates a logical design for the ASIC, and a back-end design process that creates a physical design for the ASIC. The front-end design process begins with providing a design entry 10 for an electronic circuit that is used to generate a high-level electronic circuit description, which is typically written in a Hardware Description Language (HDL) 12.

Interconnect statistical data 14 is used to create a wire load model 16, which defines the resistance, capacitance, and the area of all nets in the design. The statistically generated wire load model 16 is used to estimate the wire lengths in the design and define how net delays are computed. The HDL 12 and the wire load model 16 are then input into a logic synthesis tool 18 to generate a list of logic gates and their interconnections, called a "netlist" 20. Next, system partitioning is performed in step 22 in which the physical design is partitioned to define groupings of cells small enough to be timed accurately with wire load models 16 (local nets). The resulting design typically includes many cells with many interconnect paths. A prelayout simulation is then performed in step 24 with successive refinement to the design entry 10 and to logic synthesis 18 to determine if the design functions properly.

After prelayout simulation 24 is satisfactory, a layout tool 25 is used to create physical layout of the design begining with floorplanning in step 26 in which the blocks of the netlist 20 are arranged on the chip. The location of the cells in the blocks are then determined during a placement process in step 28. A routing process makes connections between cells and blocks in step 30. Thereafter, circuit extraction determines the resistance and capacitance of the interconnects in step 32. A postlayout simulation is then performed in step 34 from which the overall timing and performance of the chip can be determined, with successive refinement to floorplanning 26 as necessary.

In today's semiconductor industry, customers contract with chip manufacturers to design and produce highly customized integrated circuit designs. During the design flow of a custom integrated circuit design, it is not uncommon for the customer to request changes to the design, especially after postlayout simulation 34. The customer may request changes after post layout simulation 34 using two methods. One method is to submit engineering change orders (ECO) to the manufacturer who then inputs the ECOs 54 into the layout tool 25 to apply the changes to the layout. The second method is for the customer to incorporate the changes into a copy of the netlist 20, and submit the modified netlist 48 to the manufacturer. The manufacturer then inputs the modified netlist 48 into the layout tool 25, which applies the changes in the modified netlist 48 into the existing layout database.

Both methods for implementing customer changes in a design layout to suffer disadvantages. The first method where the customer submits ECOs 54 to the manufacturer requires hand-generation of net-list based ECO information, followed by an automation that checks the validity of the hand-generated ECO information. Hand generating ECOs 54 is error-prone to. In addition, there needs to be a checker to validate the hand-generated information, which adds an additional cumbersome step is the layout process flow.

In the second method, the layout tool 25 must create a new layout from the modified netlist 48, and then compares the two layouts to determine what changes need to be made to the existing layout. This can be problematic because the manufacturer cannot determine what the ECOs 54 are until the modified layout 50s built and compared to the original layout. In addition, the current approach compares two layouts, which is both time-consuming and costly. This existing approach is also said to be cumbersome to work with and in some cases does not work correctly.

The present invention provides an improved method for optimizing the netlist-based ECO flow for rapid design turnaround time.

SUMMARY OF THE INVENTION

The present invention provides a method and system for optimizing a netlist change order flow is disclosed, wherein a design layout created by a layout tool using a reference netlist is to be changed by a modified version of the netlist, and wherein both netlists are hierarchical comprising. Aspects of the present invention include comparing the modified netlist with the original netlist outside of the layout tool, and automatically generating at least one change order based on differences found between the two netlists. After the change order is generated, the change order is then applied to the design layout to generate a modified design layout.

According to the method and system disclosed herein, the present invention provides a software tool that is capable of generating change orders outside of the layout tool, eliminating the need to use the layout tool to generate ECOs. The present invention also makes it easy for customers and design engineers to determine what the ECOs are and to validate the ECOs 54 before updating the original layout.

DETAILED DESCRIPTION OF THE INVENTION

The present invention relates to a method for generating ECOs 54 from a modified netlist 48. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 2:
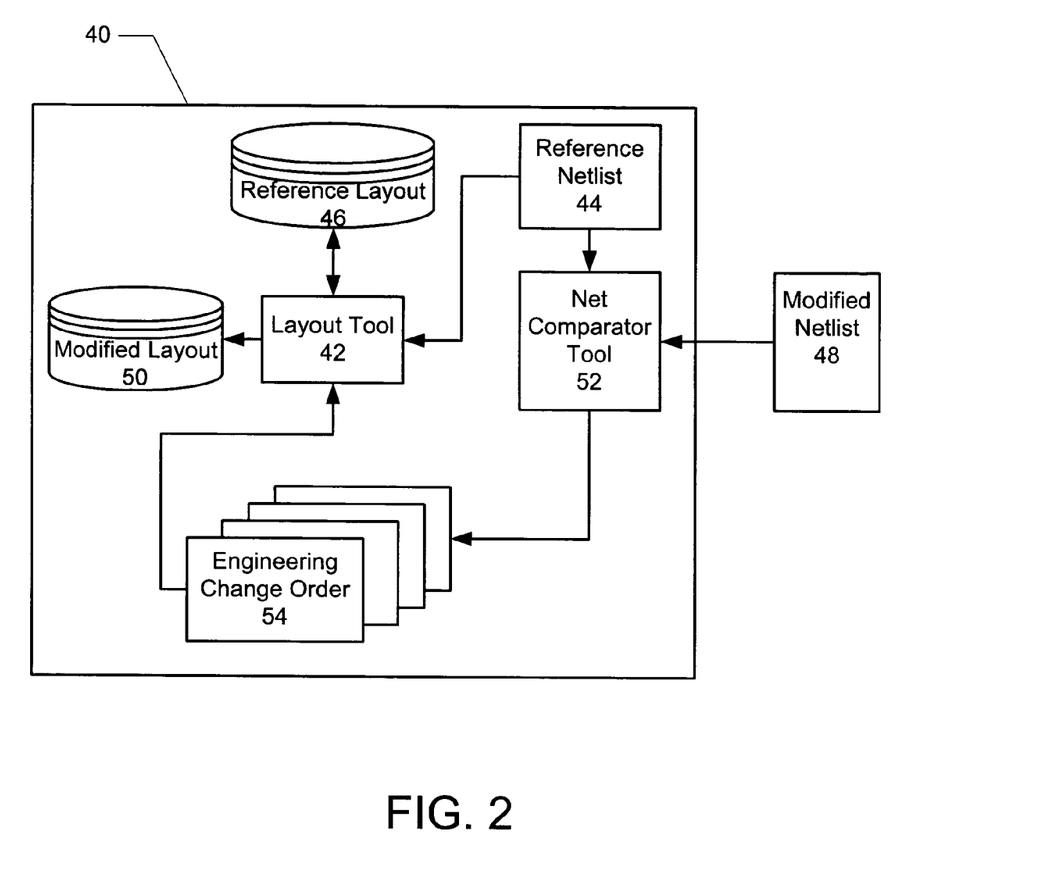
FIG. 2 is a block diagram illustrating a software and hardware environment in which the present invention may be implemented.

FIG. 2 is a block diagram illustrating a software and hardware environment in which the present invention may be implemented. During normal design flow of an integrated circuit, design engineers execute multiple design automation tools on one or more computers 40, which include layout tool 42. As described above, a netlist, referred to herein as reference netlist 44, is input to the layout tool 42 to generate a reference layout 46. However, after postlayout simulation, the customer may decide to request changes to the design represented by the reference layout 46 by submitting a modified netlist 48 to the manufacturer. The modified netlist 48 is the netlist obtained after the customer modifies the reference netlist 44 to incorporate any changes to the circuit design the customer may have. Both the reference netlist 44 and the modified netlist 48 are hierarchical in nature.

Conventionally, the manufacturer would then input the modified netlist 48 to the layout tool 42 to create a new layout. The layout tool 42 would then compare the two layouts to determine what changes need to be made to the existing layout. This solution is problematic because the manufacturer cannot deter mine what the changes are until the modified layout 50 is built and compared to the original layout. Also redoing the layout process a second time and comparing the two layouts is time-consuming and costly.

The present invention optimizes the post-layout design flow after a modified netlist 48 is submitted. The present invention generates a modified layout 50 corresponding to the modified netlist 48 by updating the reference layout 46 with only the changes from the modified netlist 48 that are applicable, without having to repeat the entire layout process using the entire modified netlist 48 as a new. The present invention accomplishes this goal by providing a net comparator tool 52 that is compares the hierarchical reference and modified netlists 44 and 48 outside of the layout tool 42 and automatically generates engineering change orders (ECOs 54) 54 based on differences found between the two netlists 44 and 48. The ECOs 54 are then input to the layout tool 42, which then applies the specified changes to the reference layout 46 to generate a modified layout 50.

Figure 3:
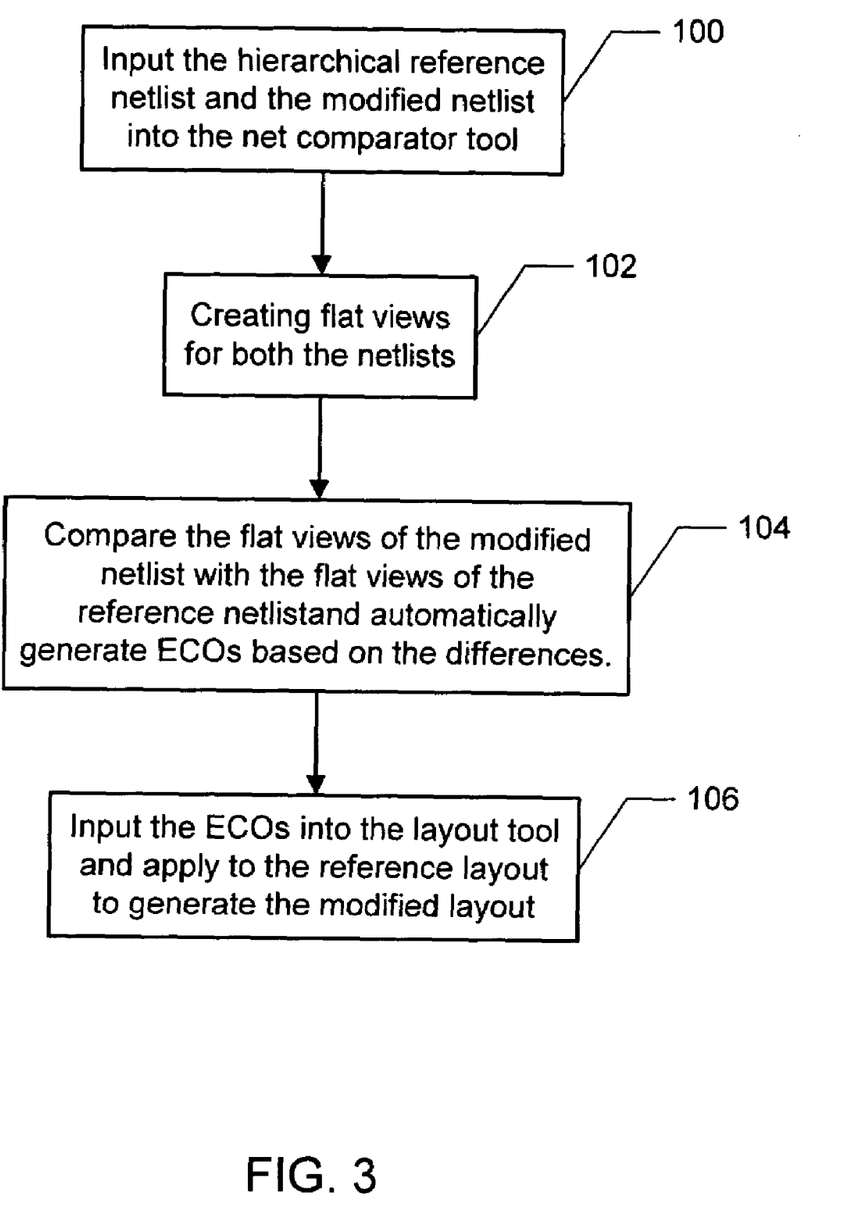
FIG. 3 is flow diagram illustrating the process of optimizing the post-layout design flow by comparing two hierarchical netlists in accordance with a preferred embodiment of the present invention.

FIG. 3 is flow diagram illustrating the process of optimizing the post-layout design flow by comparing two hierarchical netlists in accordance with a preferred embodiment of the present invention. The process begins in step 100 by inputting the hierarchical reference netlist 44 and the modified netlist 48 into the net comparator tool 52.

Figure 4A:
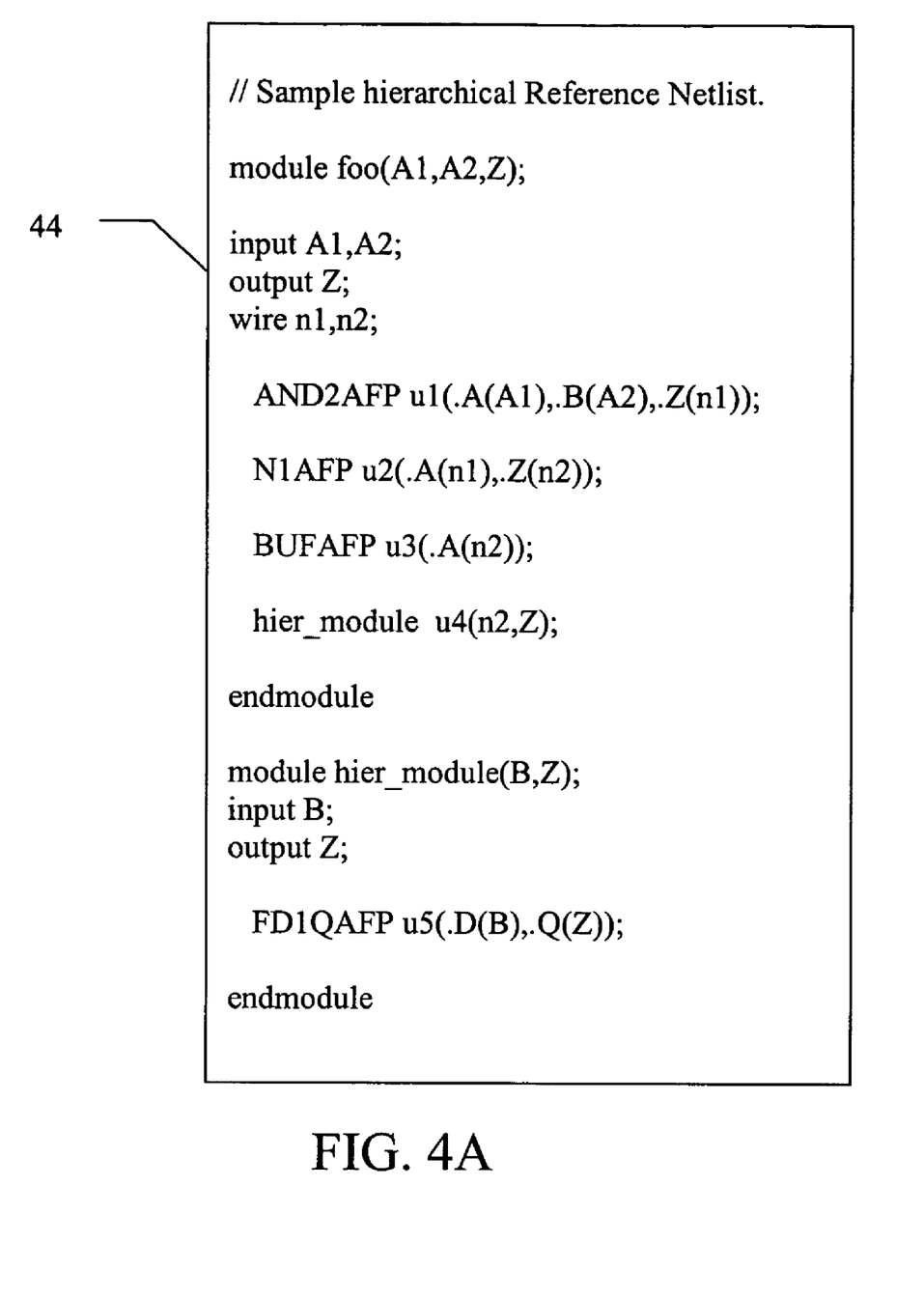
FIGS. 4A and 4B illustrate an example hierarchical reference netlist in verilog HDL, and corresponding graphical representation of the reference netlist 44, respectively.
Figure 4B:
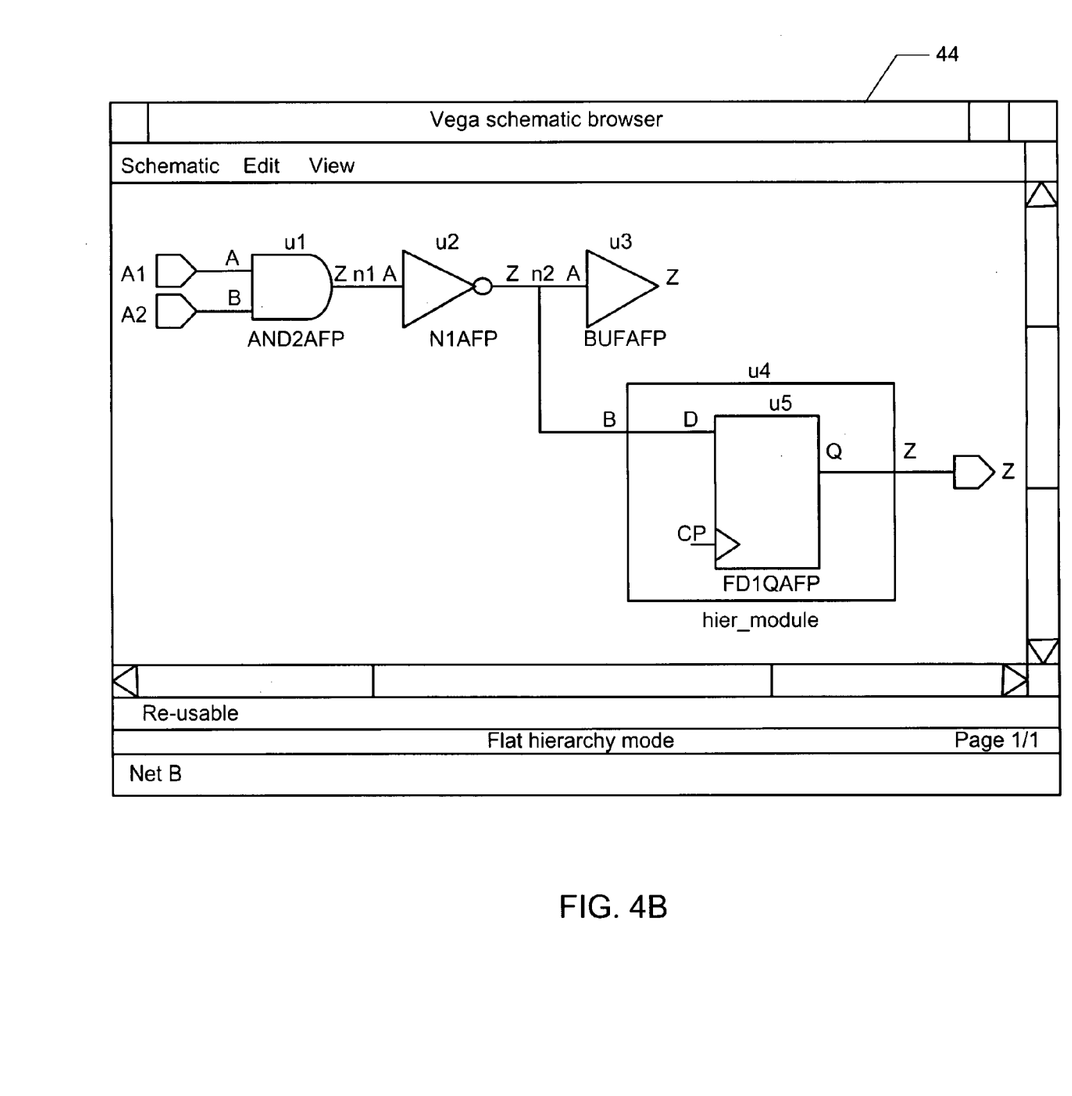

FIGS. 4A and 4B illustrate an example hierarchical reference netlist 44, and corresponding graphical representation of the reference netlist 44, respectively. The reference netlist 44 includes a hierarchy of modules, each of which may comprise any number of design elements such as cells, nets and pins, and other modules. For example, reference netlist 44 comprises a top module named foo that includes two inputs A1 and A2, and one output Z. The module further includes four cells foo.u1, foo.u2, foo.u3, foo.u4, where cell u4 (hier_module) is a hierarchical module that further includes cell u5. It should be noted that cell u4 does not appear in reference layout 46 because layouts are flat and thus, do not include hierarchical information. Although not shown, the elements listed in netlists in general include attributes that identify information about the element, such as cell type. For instance, cell u1 has a cell-type of AND2AFP, which is AND gate; cell u2 has a cell-type of N1AFP, which is an inverter; and cell u3 has a cell-type BUFAFP, which is a buffer.

Figure 5A:
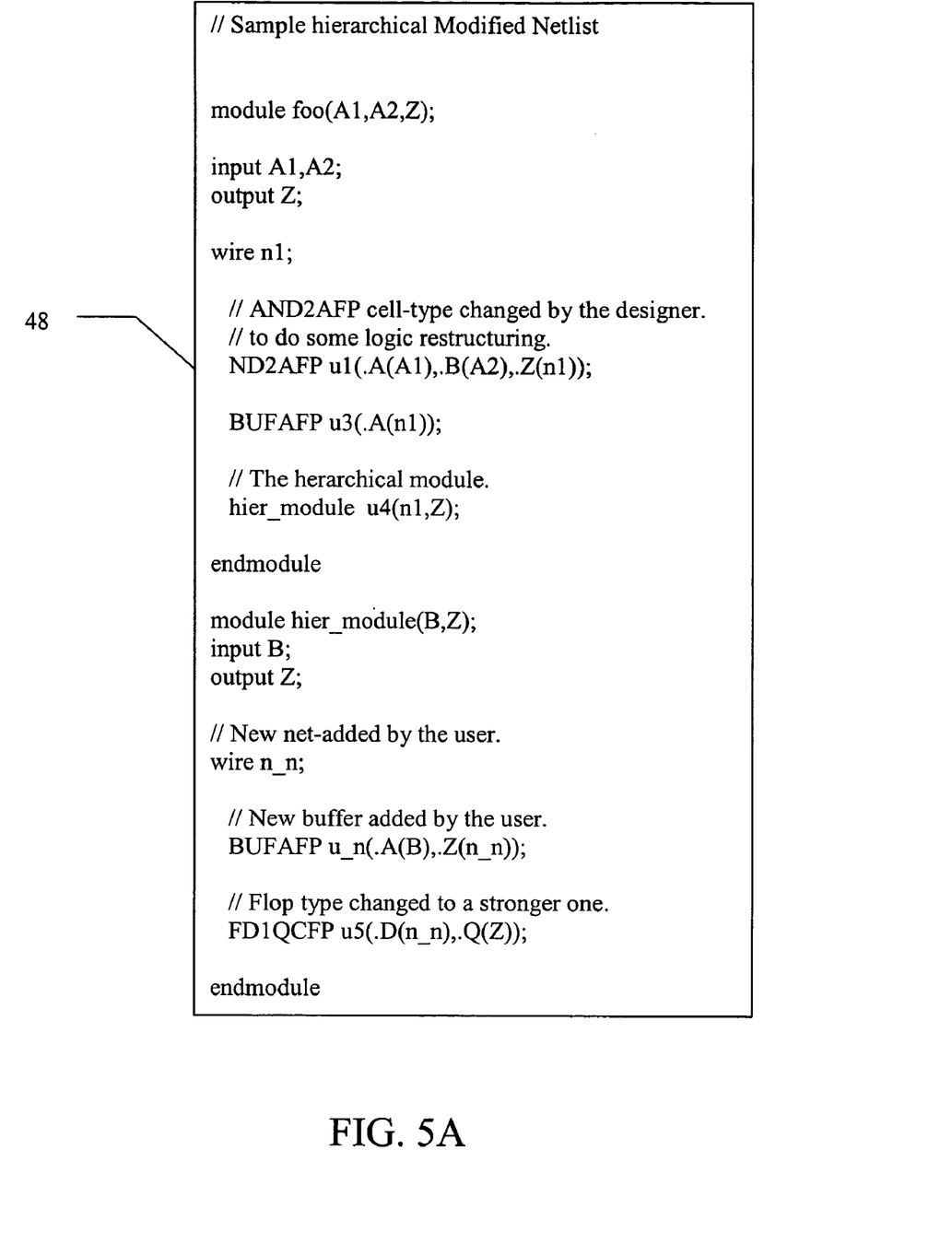
FIGS. 5A and 5B illustrate an example modified netlist in verilog HDL and corresponding graphical representation of the modified netlist, respectively.
Figure 5B:
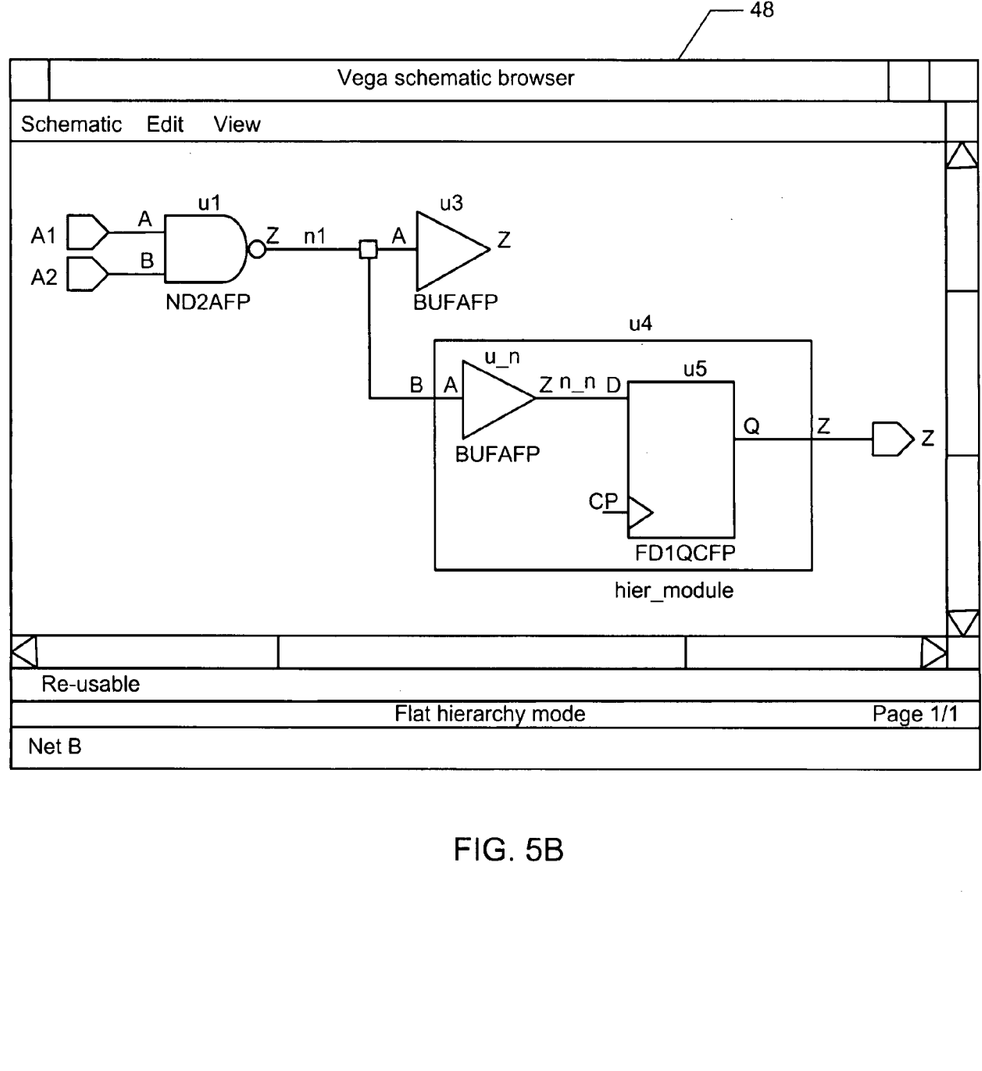

FIGS. 5A and 5B illustrate an example modified netlist 48 and corresponding graphical representation of the modified netlist 48, respectively. As shown, the modified netlist 48 incorporates the following changes that were made to the reference netlist 44:

a. Logic restructuring to change cell u1 to an inverter (ND2AFP) gate. The name of the ND2AFP gate remains as foo.u1.
b. Delete inverter foo.u2.
c. Add a new buffer, foo.u4.u_n inside module cell u4.
d. Add new net foo.u4.n_n to connect the buffer output.
e. Upgrade the cell-type for flop foo.u4.u5 from FD1QAFP to FD1QCFP.

Referring again to FIG. 3, the process of comparing the two netlists 44 and 48 begins in step 102 by internally creating flat views for both the netlists 44 and 48. In a preferred environment of the present invention, the flat views maintain only library and hard macro cells after filtering out module level hierarchies. Such library and hard macro cells are referred to as leaf cells. The pins of these leaf cells are connected by special net name (top-to name), and all other names of the nets across hierarchies are ignored. Bus nets and bus pins are kept as individual scalar pins and scalar nets, respectively.

The internal flat views are implemented as two important data structures, an instance map and a net-map. The instance map maintains a mapping of hierarchical leaf-level instance names and corresponding instance types, which excludes modules. For example, because instance foo.u4 is a module and not a leaf level cell, it is not included in the instance map.

According the present invention, the comparator tool 52 would create the following instance map for the reference netlist 44 of FIG. 4A:

| Name | Type |
| --- | --- |
| foo.u1 | AND2AFP |
| foo.u2 | N1AFP |
| foo.u3 | BUFAFP |
| foo.u4.u5 | FD1QAFP |

The comparator tool 52 would create the following instance map for the modified netlist 48 of FIG. 5A:

| Name | Type |
| --- | --- |
| foo.u1 | ND2AFP |
| foo.u3 | BUFAFP |
| foo.u4.u_n | BUFAFP |
| foo.u4.u5 | FD1QCFP |

The net map created by the comparator tool 52 contains a list of the nets and the corresponding pins for the nets across all module hierarchies. The top-net is used to represent the net across hierarchies. The pins for the net are represented as a set. For simplicity purpose, it is assumed that the name of the net in the reference layout 46 is same as the top-net name. This assumption is true in conventional layout databases, such as ones produced by Synopsys/Avanti. The comparator tool 52 of the present invention would still work, however, even if this is not the case, so long as the changes to the modified netlist 48 do not move nets across hierarchies, which does not typically happen in conventional design ECOs 54.

A relevant subset of the net map for the reference netlist 44 of FIG. 5A is as follows:

| foo.n1 | { foo.u1.Z, foo.u2.A } |
| foo.n2 | { foo.u2.Z, foo.u3.A, foo.u4.u5.D } |

The relevant subset of the net map for the modified netlist 48 of FIG. 5B is as follows:

| foo.u4.n_n | { foo.u4.u_n.Z, foo.u4.u5.D } |
| foo.n1 | { foo.u1.Z, foo.u3.A, foo.u3.u_n.A } |

After the two flat views for both netlists 44 and 48 are generated, in step 104, the comparator tool 52 compares the flat views of the modified netlist 48 with the flat views of the reference netlist 44, and automatically generates ECOs 54 based on the differences. Comparing the flat views and automatically generating ECOs 54 is an iterative process of finding all of the differences between the modified netlist 48 and the reference netlist 44. For each mismatch, a corresponding set on one more ECOs 54 is generated. In a preferred embodiment, each ECO 54 is input to the layout tool 42 as the ECO 54 is generated to ensure that the changes made to the reference layout 46 at any given time is consistent with the ECOs 54 generated so far. The ECO generation process continues until all of the differences between the reference netlist 44 and the modified netlist 48 are processed.

The following ECO syntax is used in the example. The exact ECO syntax could be different for different layout tools.

| ECO Syntax | Action performed by layout tool |
|---|---|
| add <cell> <cell-type>; | Adds a new cell with the given cell-type. |
| remove <cell> <cell-type>; | Removes a given cell. |
| connect <cell1> <pin1> <cell2> <pin2>; | Disconnects pin1 from the original net. Connects pin1 to the net connected to the pin pin2. |
| disconnect <cell> <pin> ; | Disconnects pin from its net. |
| replace <cell> <new-cell-type> | Swaps the cell-type of a cell with a new cell-type. The pin-order of the new-cell must match the original cell-type pin-order. |
| rename_net <cell> <pin> <new-net> | Creates a new net and connects the pin the newly created net. |

The comparison process and generation of corresponding ECOs is different for cells and nets. With respect to cells, the modified netlist 48 could have cells deleted, added, or present with a different cell-type when compared with the reference netlist 44. The process of comparing cells begins with sequentially reading and comparing the two instance maps. Each the leaf cell in the instance maps are considered and compared. An ECO is generated in response to the following three possibilities: 1) a leaf cell is in the reference instance map, but not in the modified instance map; 2) a leaf cell is in the modified instance map, but not in the reference instance map; 3) a leaf cell is in both instance maps, but there is a cell-type mismatch, and the pin order may or may not match. For addition and deletion of cells, corresponding "add cell" and "delete cell" ECOs 54 generated. For cells with the same name but different cell-type, the pin-order of the cells could match or could be different. In the former case, a "cell-type swap" ECO is generated, where in the later case, a detailed ECO sequence, such as "remove cell, add new cell, followed by connect to individual pins" is generated.

A comparison of the instance maps for the example netlists 44 and 48 results of the following:

a. Cell foo.u1 exists in both instance maps, but the cell-type is different. Therefore, a comparator tool 52 generates a cell-type swap ECO, "replace foo.u1 ND2AFP."
  b. Cell foo.u3 exists in the instance maps for both netlists with no change. Therefore, there is no ECO generation.
  c. Cell foo.u4.u_n is not in the reference instance map, but is in modified instance map. Therefore, the comparator tool 52 generates an add ECO, "add foo.u4.u_n BUFAFP."
  d. Cell foo.u4.u5 exists in both instance maps the cell-type is different. Therefore, the comparator to 12 generates a cell-type swap ECO, "replace foo.u4.u5 FD1QCFP."

After the instance maps compared, the comparator tool 52 compares the net map for the modified netlist 48 with the net map for the reference netlist 44. Each net in the modified netlist 48 could be either an existing net when compared with the reference netlist 44. In case of an existing net, there could be new pins on the net. For the new pins present on the net, corresponding "pin-to-net connect" ECOs are generated.

There are two possible scenarios when a new net is found in the modified netlist 48. In the first scenario there is actually a new net added to the modified netlist 48, while in the second scenario a change of net hierarchies leads to a new top-net. Since the comparator tool 52 does not know the name of the net in the reference layout 46, a conservative approach is taken where the comparator tool 52 generates a "pin-to-net connection" ECO for all pins on the net in both of the above cases. The pin-to-net connect ECO connect a pin to a new net. This ensures that the ECO generation process is independent and does not need any information from the reference layout 46. Instead of explicitly, mentioning the name of the net to be connected, the "pin-to-net connection" ECO rather refers to any pin on the net. This avoids the issue where the net name in the layout tool 42 is different from the top-net name in the hierarchical netlist. Because the pin names are unique between the hierarchical netlist and the flat view, ECO processing in the layout tool 42 can discover which net is connected to the pin and then connect the pin to the net.

In the present example, the comparison and ECO generation process would result of following:

Cell foo.u3.n_n is a new-top net, which is not present in the reference netlist 44. Therefore, the comparator tool 52 must generate one or more ECOs 54 to create a new-net and connect all the pins in the pin-set to this new net. The following the ECOs 54 need to be generated:

a. disconnect foo.u4.u5 D;
b. rename_net foo.u4.u5 D foo.u4.n_n; (rename_net renames the net connected to the pin foo.u4.u5 D to foo.u4.n_n. This ensures that the new-net is properly created.)
c. connect foo.u4.u_n Z foo.u4.u5 D;

The net foo.n1 is an existing old net. However, new pins on the net are identified in the modified net map. For each new pin, a connect ECO is generated. For example, for new pin foo.u3, the comparator tool 52 generates a generate ECO, "connect foo.u3 A foo.u1 Z." For new pin foo.u3.u_n, the comparator tool 52 generates a generate to ECO, "connect foo.u4.u_n A foo.u1 Z."

The comparator tool 52 now generates remove ECOs 54 for instances that are deleted from reference netlist 44. The following ECO is generated: "remove foo.u2".

At the end of the comparison and ECO generation process, the comparator tool 52 generates the following list of the ECOs 54:
a. replace foo.u1 ND2AFP;
b. add foo.u4.u_n BUFAFP;
c. replace foo.u4.u5 FD1QCFP;
d. disconnect foo.u4.u5 D;
e. rename_net foo.u4.u5 D foo.u4.n_n;
f. connect foo.u4.u_n Z foo.u4.u5 D;
g. connect foo.u3 A foo.u1 Z;
h. connect foo.u4.u_n A foo.u1 Z;
i. remove foo.u2;

Referring still to FIG. 3, after the list of ECOs 54 is generated, in step 106, an operator inputs the ECOs 54 to the layout tool 42 where they are applied to the reference layout 46, generating the modified layout 50. The modified layout 50 now represents the modified netlist 48 provided by the customer.

A method of system for comparing two hierarchical netlists have been disclosed to generate change orders that update an IC layout. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A method for optimizing a netlist change order flow, wherein a design layout created by a layout tool from a reference netlist is to be changed by a modified version of the netlist, wherein both netlists are hierarchical, the method comprising:
(a) comparing the modified netlist with the reference netlist outside of the layout tool, wherein the comparing comprises generating a first instance map data structure and a first net map data structure corresponding to a flat view of the reference netlist, and generating a second instance map data structure and a second net map data structure corresponding to a flat view of the modified netlist, wherein each of the first and second instance map data structures maintain a mapping of leaf-level instance names, and wherein each of the first and second net map data structures maintain a list of nets;
(b) automatically generating at least one change order based on differences found between the first and second instance map data structures and between the first and second net map data structures; and
(c) applying the change order to the design layout to generate a modified design layout.

2. The method of claim 1 further including the step of: providing a software tool for performing steps (a) and (b).

3. The method of claim 2 wherein step (a) further includes the step of: inputting the reference netlist and the modified netlist into the software tool.

4. The method of claim 3 wherein step (a) further includes the step of: comparing the reference netlist and the modified netlist in a flat manner.

5. The method of claim 4 wherein step (a) further includes the step of: creating flat views for both the reference netlist and the modified netlist.

6. The method of claim 5 wherein the first and second instance map data structures comprise an instance map, and wherein the first and second net map data structures comprise a net map.

7. The method of claim 6 wherein step (a) further includes the step of:
maintaining in each of the instance maps a mapping of hierarchical leaf-level instance names and corresponding instance types, wherein modules are excluded.

8. The method of claim 5 wherein step (a) further includes the step of:
maintaining in each of the net maps a list of nets and corresponding pins for the nets across all module hierarchies.

9. The method of claim 8 wherein step (a) further includes the step of:
using a top-net to represent a net across hierarchies and representing the pins for the net as a set.

10. The method of claim 9 wherein step (a) further includes the step of:
assuming that a name of the net in the design layout is the same as the top-net name.

11. The method of claim 9 wherein step (a) further includes the step of:
comparing the flat views of the modified netlist with the flat views of the reference netlist by:
(i) sequentially reading and comparing the leaf cells in the first and second instance maps; and
(ii) comparing the second net map for the modified netlist with the first net map for the reference netlist.

12. The method of claim 6 wherein step (b) further includes the step of:
generating an Engineering Change Order (ECO) in response to any one of the following: 1) a leaf cell is in the first instance map, but is not in the second instance map; 2) a leaf cell is in the second instance map, but is not in the first instance map; 3) a leaf cell is in both first and second instance maps, but there is a cell type mismatch.

13. The method of claim 2 wherein step (c) further includes the step of:
inputting the change order into the layout tool to apply changes and to generate the modified layout.

14. A computer-readable medium containing program instructions which when executed by a computer optimizes for a netlist change order flow, wherein a design layout created by a layout tool from a reference netlist is to be changed by a modified version of the netlist, wherein both netlists are hierarchical, the program instructions for:
(a) comparing the modified netlist with the reference netlist outside of the layout tool, wherein the comparing comprises generating a first instance map data structure and a first net map data structure corresponding to a flat view of the reference netlist, and generating a second instance map data structure and a second net map data structure corresponding to a flat view of the modified netlist, wherein each of the first and second instance map data structures maintain a mapping of leaf-level instance names, and wherein each of the first and second net map data structures maintain a list of nets;

(b) automatically generating at least one change order based on differences found between the first and second instance map data structures and between the first and second net map data structures; and (c) applying the change order to the design layout to generate a modified design layout.

15. The computer-readable medium of claim 14 further including the instruction of:

providing a software tool for performing instructions (a) and (b).

16. The computer-readable medium of claim 15 wherein instruction (a) further includes the instruction of:

inputting the reference netlist and the modified netlist into the software tool.

17. The computer-readable medium of claim 16 wherein instruction (a) further includes the instruction of:

comparing the reference netlist and the modified netlist in a flat manner.

18. The computer-readable medium of claim 17 wherein instruction (a) further includes the instruction of:

creating flat views for both the reference netlist and the modified netlist.

19. The computer-readable medium of claim 18 wherein the first and second net map data structures comprise an instance map, and wherein the first and second instance map data structures comprise a net map.

20. The computer-readable medium of claim 19 wherein instruction (a) further includes the instruction of: maintaining in each of the instance maps a mapping of hierarchical leaf-level instance names and corresponding instance types, wherein modules are excluded.

21. The computer-readable medium of claim 18 wherein instruction (a) further includes the instruction of:

maintaining in each of the net maps a list of nets and corresponding pins for the nets across all module hierarchies.

22. The computer-readable medium of claim 21 wherein instruction (a) further includes the instruction of:

using a top-net to represent a net across hierarchies and representing the pins for the net as a set.

23. The computer-readable medium of claim 22 wherein instruction (a) further includes the instruction of:

assuming that a name of the net in the design layout is the same as the top-net name.

24. The computer-readable medium of claim 22 wherein instruction (a) further includes the instruction of:

comparing the flat views of the modified netlist with the flat views of the reference netlist by:
(i) sequentially reading and comparing the leaf cells in the first and second instance maps; and
(ii) comparing the second net map for the modified netlist with the first net map for the reference netlist.

25. The computer-readable medium of claim 19 wherein instruction (b) further includes the instruction of:

generating an Engineering Change Order (ECO) in response to any one of the following: 1) a leaf cell is in the first instance map, but not in the second instance map; 2) a leaf cell is in the second instance map, but is not in the first instance map; 3) a leaf cell is in both first and second instance maps, but there is a cell type mismatch.

26. The computer-readable medium of claim 15 wherein instruction (c) further includes the instruction of:

inputting the change order into the layout tool to apply changes and to generate the modified layout.

* * * * *